United States Patent
Heo et al.

(10) Patent No.: US 6,398,904 B1
(45) Date of Patent: Jun. 4, 2002

(54) WET ETCHING SYSTEM FOR MANUFACTURING SEMICONDUCTOR DEVICES

(75) Inventors: Yong-woo Heo, Yongin; Heoung-bin Lim, Sungnam, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/323,014

(22) Filed: Jun. 1, 1999

(30) Foreign Application Priority Data

Jun. 23, 1998 (KR) .............................. 98-23773

(51) Int. Cl.[7] .................................................. C23F 1/02
(52) U.S. Cl. ........................................ 156/345; 118/726
(58) Field of Search ........................... 156/345; 118/726

(56) References Cited

U.S. PATENT DOCUMENTS

| | | | |
|---|---|---|---|
| 3,964,957 A | * | 6/1976 | Walsh ........................ 156/345 |
| 4,302,273 A | * | 11/1981 | Howard, Jr. ................ 156/345 |
| 4,624,214 A | * | 11/1986 | Suzuki et al. ............... 118/719 |
| 5,022,949 A | * | 6/1991 | Jengo ......................... 156/345 |
| 5,401,316 A | * | 3/1995 | Shiraishi et al. ............. 118/689 |
| 6,001,215 A | * | 12/1999 | Ban ............................. 156/345 |
| 6,039,835 A1 | * | 3/2001 | Mangat et al. ............. 156/345 |
| 6,228,211 B1 | * | 5/2001 | Jeong ......................... 156/345 |

* cited by examiner

Primary Examiner—Benjamin L. Utech
Assistant Examiner—Charlotte A Brown
(74) Attorney, Agent, or Firm—Volentine Francos, PLLC

(57) ABSTRACT

A wet etching system includes a tank for containing a chemical and having an open top portion, and a heater disposed in the tank for heating the chemical contained therein. A cover is arranged on the open top portion of the tank, and the cover includes a cooling apparatus formed therein. The wet etching method includes placing a semiconductor substrate, having a layer thereon to be etched, into the tank, and then driving the heater to maintain the chemical within a temperature range. Deionized water in the chemical evaporates when the temperature range is greater than a boiling point of the deionized water. The evaporated deionized water condenses on the cooler cover and then flows back into the tank to maintain a constant chemical concentration.

10 Claims, 3 Drawing Sheets

WET ETCHING SYSTEM FOR MANUFACTURING SEMICONDUCTOR DEVICES

BACKGROUND OF THE INVENTION

1. Field of the Invention

The present invention relates to a wet etching system for manufacturing semiconductor devices and a wet etching method using the same, and more particularly, to a wet etching system and method for etching a nitride layer, formed on a semiconductor substrate, for a short period of time while maintaining the concentration of phosphoric acid ($H_3PO_4$) constant.

2. Description of the Related Art

Generally, semiconductor devices are manufactured by forming multiple insulating layers or conductive layers on a semiconductor substrate, and then forming a specific electrical pattern on the layers according to desired characteristics of the particular semiconductor device being manufactured.

The formation of the specific pattern is achieved by selectively removing designated portions of the insulating layers and/or the conductive layers by an etching process. There are two types of etching processes: dry etching using a plasma generated in a reaction chamber, and wet etching using a particular chemical that is capable of removing the layer to be etched. The wet etching process is carried out using a wet etching system employing a tank containing the chemical etchant.

FIG. 1 schematically illustrates a conventional etching system for manufacturing semiconductor devices, employing a chemical bath comprising a tank 10 for containing a chemical 16 for etching a certain layer on the semiconductor substrate. Normally, the chemical 16 is diluted with deionized water, with the degree of dilution being controlled depending on the etching process.

A heater 12 heats the chemical 16 inside the tank 10 to a certain temperature sufficient for the process conditions of the etching process. Typically, bar-shaped heaters 12 are disposed in the chemical 16 at opposing sides of the tank 10.

A bubbler 14 is connected to the tank 10 and is used to generate bubbles in the chemical 16 inside the tank 10 in order to improve the reaction of the chemical 16 and a wafer placed in the chemical bath.

The temperature of the chemical 16 and the etching process time are important parameters in the etching process. However, heating the chemical 16 causes the deionized water, which was used to dilute the chemical, to evaporate. As a result, the concentration of the chemical 16 within the tank 10 is increased due to the evaporation of the deionized water, and thus, deionized water must be supplied in an amount equal to the evaporated amount in order to maintain the chemical 16 concentration constant. In some cases, additional amounts of chemical 16 are supplied to the tank 10 to maintain the chemical 16 concentration constant.

However, precisely controlling the concentration changes of the chemical due to the evaporation of the deionized water is not easy, despite the continuous supply of the deionized water, because the concentration of the chemical 16 inside the tank 10 is not constant.

Although the chemical concentration changes can be detected by changes in the etch rate observed during the etching process, such observations occur after a particular wafer may have suffered a fatal defect caused by a failure of the pattern profile during the etching process. In other words, precise control of the etching process is difficult when using data generated after the etching process is performed.

Another drawback of the conventional wet etching system is that the temperature of the chemical 16 decreases as the deionized water is continuously supplied to the tank 10, and thus the heater 12 must be continuously driven to heat the chemical 16 to the desired etching temperature, which shortens the life span of the etching system itself.

Referring to FIG. 1, the etching process for a nitride layer is described. First, a chemical 16 for etching the nitride layer, such as phosphoric acid ($H_3PO_4$), is supplied in the tank 10. The concentration of the phosphoric acid ($H_3PO_4$) is 85%, with the remainder being deionized water. Although the phosphoric acid concentration is relatively high, the etch rate for the nitride layer is good at this concentration value.

The phosphoric acid ($H_3PO_4$) is heated so as to maintain its temperature between about 170° C. to 174° C. according to the process conditions of the etching process, and then, the etching process is carried out. The etching process time depends on the thickness of the nitride layer.

However, as describe above, the required continuous supply of deionized water and the chemical to the tank 10 causes difficulties in trying to precisely control the chemical concentration inside the tank 10, which causes uneven etch rates. Further, because the heater 12 is bar-shaped, it takes a long time to heat the phosphoric acid ($H_3PO_4$) and maintain its temperature, which may damage the heater and shorten the life time of the etching system.

Moreover, after the etching process is completed, the disposal and the cleaning of the remaining waste solution, including the deionized water, the chemical, etc. due to the continuous supply thereof remains a difficult problem.

SUMMARY OF THE INVENTION

The present invention is directed to a wet etching system for manufacturing semiconductor devices and a wet etching method using the same, which provides efficient and precise execution of the etching process while maintaining the concentration of the chemical etchant constant.

Another object of the present invention is to provide a wet etching system for manufacturing semiconductor devices and a wet etching method using the same, which decreases the process temperature of the chemical to one that is lower than the conventional art, and increases the etch rate of the etching process, while maintaining the concentration of the chemical constant to thereby reduce the etching process time.

To achieve these and other advantages and in accordance with the purpose of the present invention, as embodied and broadly described, the wet etching system for manufacturing semiconductor devices comprises an open topped tank containing a chemical diluted with deionized water to wet-etch a certain layer on a semiconductor substrate. A heater is disposed in the tank, and a cover is employed to cover the open top of the tank. The cover includes a cooling apparatus that condenses the deionized water evaporated by the heating of the heater.

The lower surface of the cover gradually slopes downwardly from opposing edges of the cover toward either a central lateral or longitudinal axis thereof, which facilitates collection of the condensed deionized water. A discharge opening is provided in the cover, in flow communication with the ambient outside of the tank, so that gas can be easily discharged from the tank.

The tank and the cover may be made of a chemically-resistant material, such as TEFLON™, and the surface of the heater may be coated with TEFLON™ as well.

In another aspect of the present invention, there is provided a wet etching method comprising supplying a chemical diluted with deionized water into a tank having a top portion with a cover arranged thereon, the cover having a cooling apparatus formed therein. A semiconductor substrate, having a layer thereon to be etched, is placed into the tank. A heater disposed within the tank maintains the chemical within a temperature range. The deionized water evaporates when the temperature range is greater than a boiling point of the deionized water. The deionized water then condenses on the cooler cover, before flowing back into the tank. The etching process is carried out while the evaporation and condensing steps are performed.

Where the layer to be etched is a nitride layer, the chemical supplied into the tank is a phosphoric acid ($H_3PO_4$) diluted with deionized water, the concentration of the phosphoric acid ($H_3PO_4$) being from 80% to 90%. The chemical is heated to maintain its temperature between about 153° C. to 157° C.

It is to be understood that both the foregoing general description and the following detailed description are exemplary and explanatory and are intended to provide further explanation of the invention as claimed.

DETAILED DESCRIPTION OF PREFERRED EMBODIMENTS

Preferred embodiments of the present invention will now be described in detail with reference to the accompanying drawings.

Figure 2:
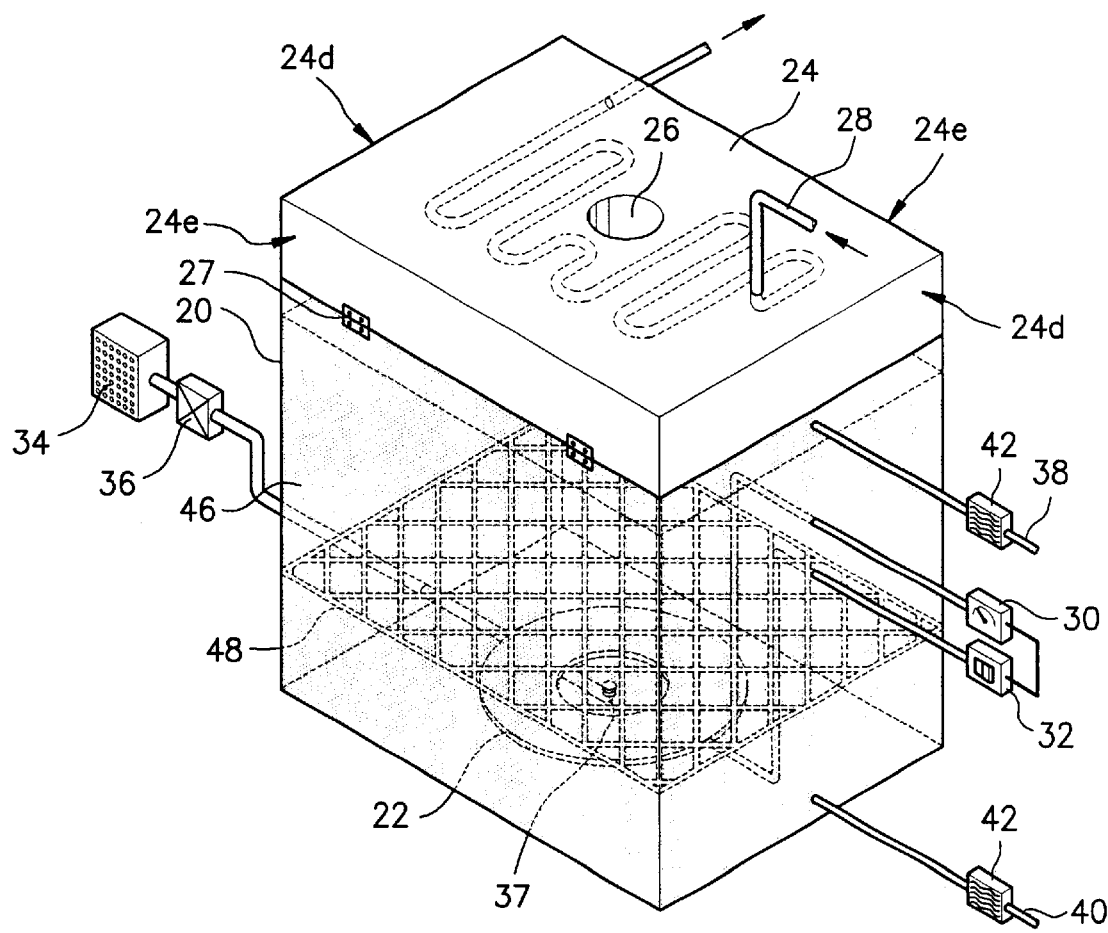
FIG. 2 is a perspective view of an embodiment of the wet etching system for manufacturing semiconductor devices according to the present invention.

FIG. 2 illustrates a wet etching system according to one embodiment of the present invention. As used herein, the term chemical is used generically to refer to either a single chemical, a solution of two or more chemicals, or a solution of a chemical and a diluent, such as deionized water.

The wet etching system comprises a tank 20 having an open top. The tank 20 is preferably made of a chemical and acid-resistant material, such as TEFLON™ (Dupont Co.), which eliminates problems cause by chemical corrosion and the like. A chemical 46 for etching a semiconductor substrate is contained within the tank 20, and the chemical is preferably a solution comprising a diluent of deionized water.

A heater 22 is provided in the lower portion of the tank 20 for heating the chemical 46 to a certain temperature. The heater 22 is ring-shaped or annular, which facilitates the uniform heating of the chemical 46 in the lower portion of the tank 20.

In close proximity to the upper portion of the tank 20, there is provided a temperature detecting device 30, for example, a thermocouple or other suitable temperature detecting device. A controller 32 controls the operation of the heater 22 according to the temperature of the chemical 46 detected by the temperature detecting device 30.

A chemical supply line 38 passes through an upper side wall of the tank 20 for supplying the chemical 46, which comprises a diluent deionized water, to the tank 20. A filter 42 is provided along the chemical supply line 38 before it enters the tank 20 to prevent the intake of contaminants. A chemical discharge line 40 passes through a lower side wall of the tank 20 for draining out the chemical 46 after it has been used for a designated time period. A filter 42 is provided on the chemical discharge line 40 after it exits the tank 20.

A cover 24 is used to seal the open top edges of the tank 20. The cover 24 prevents the deionized water used for diluting the chemical from being discharged to the ambient atmosphere, after the deionized water within the tank 20 evaporates when the temperature of the chemical 46 exceeds the boiling point of the deionized water.

Figure 3:
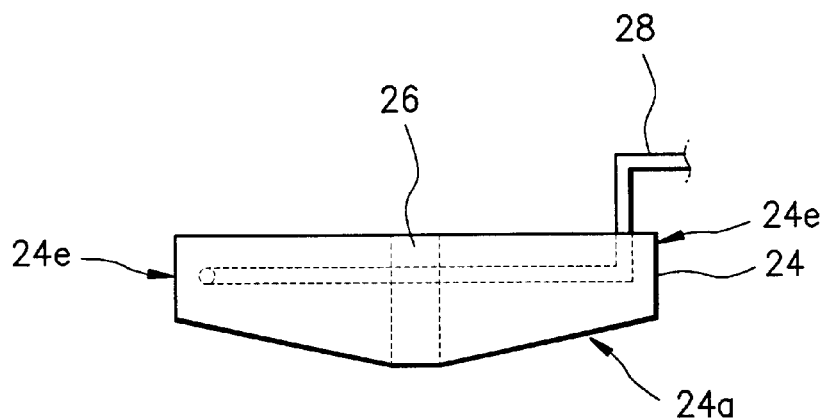
FIG. 3 is a side view of the cover of FIG. 2.

As shown in FIG. 3, the lower surface 24a of the cover 24 gradually tapers downwardly, toward the bottom of the tank, from the opposing edges of the cover to a central region of the cover 24. The lower surface 24a shown in FIG. 3 illustrates a downward taper from the opposing lateral edges 24e of the cover 24 toward a central region along the lateral axis of the cover 24. Of course, the lower surface 24a may taper downwardly from the opposing longitudinal edges 24d (see FIG. 2) of the cover 24 toward a central region along the longitudinal axis of the cover 24. In still another embodiment, the lower surface 24a may simultaneously taper downwardly from the opposing longitudinal and lateral edges 24d, 24e of the cover 24 toward a central region along the longitudinal and lateral axis of the cover 24.

As shown in FIG. 2 and FIG. 3, a cooling water line 28 is formed within the cover 24 to cool the cover 24 by flowing cooling water through the cooling water line 28. Therefore, for any of the above-described cover 24 embodiments, when the deionized water contained in the chemical 46 evaporates while the chemical 46 is heated to its proper processing temperature, the evaporated deionized water contacts the cooling water line 28 and the relatively cooler cover 24 and condenses, and the condensed deionized water flows down the tapered lower surface 24a and back into the tank 20.

A discharge opening 26 extending through the cover 24, preferably at a central longitudinal/lateral location, discharges any unwanted gases which accumulate inside the tank 20.

The cover 24 can be hinge-coupled using hinges 27 on one side of the tank 20 to allow easy opening of the cover 24. The cover 24 is also preferably made of a chemical and acid-resistant material such as TEFLON™. More preferably, the surface of the heater 22 is coated with a chemical and acid-resistant material such as TEFLON™.

A bubbler 34 is connected via a gas supply line to a lower portion of the tank 20 for bubbling the chemical 46 contained inside the tank 20 using a particular gas in order to improve the etching efficiency during the etching process. A gas supply nozzle 37 of the bubbler 34 is provided on the lower side of the heater 22. The bubbling gas can be selected from the group consisting of chloride ($Cl_2$) gas, fluorine (F) gas, or ozone ($O_3$) gas, or a mixture of at least any two of these. The gas supplied from the bubbler 34 is discharged out of the tank 20 through the discharge opening 26 provided on the cover 24.

In order to minimize decreases in the temperature of the chemical 46 due to the bubbling gas supplied as described above, a gas heating device 36 is provided on the bubbling gas supply line to preheat the bubbling gas to a predetermined temperature of about 70° C. to 80° C. before being supplied into the tank 20.

A support member 48 is provided within the tank 20, above the heater 22, to support a wafer to be etched, or a cassette of wafers to be etched. If the wet etching system of the present invention is used to etch a nitride layer formed on a semiconductor substrate, the tank would contain a chemical 46 comprised of from 80% to 90% by weight phosphoric acid ($H_3PO_4$), with the reminder being deionized water. Of course, the apparatus and method of the present invention can be used to etch any type of insulating, conductive, or semiconductive layer, using various types of conventional etchants.

Figure 4:
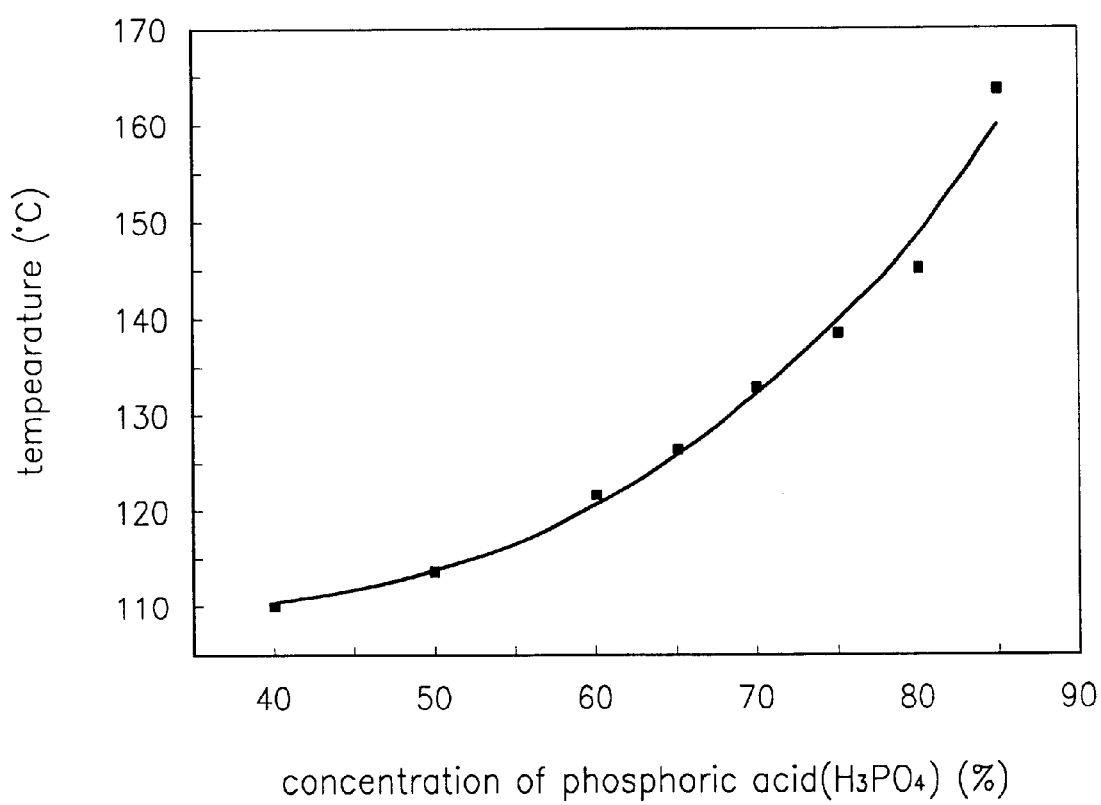
FIG. 4 is a graphical representation comparing the heating temperature as a function of the concentration of the phosphoric acid ($H_3PO_4$) as used in the present invention.

Experiments were conducted to determine the optimum process conditions for etching the nitride layer. Eight different samples, having phosphoric acid ($H_3PO_4$) concentrations of 40%, 50%, 60%, 65%, 70%, 75%, 80% and 85%, were prepared and heated from 100° C. to 180° C. FIG. 4 is a graphical representation comparing the upper heating temperature limit depending on the concentration of the phosphoric acid ($H_3PO_4$) used. The upper heating temperature limit is the temperature of the phosphoric acid ($H_3PO_4$) concentration sample which does not increase any further, even when heated for two or three hours.

As shown in FIG. 4, in case of the 40% phosphoric acid ($H_3PO_4$) concentration sample, the temperature increase stops at 113° C., and in case of the 85% phosphoric acid ($H_3PO_4$) concentration sample, the temperature increase stops at 157° C. The upper heating temperature limit exponentially increases with increasing phosphoric acid ($H_3PO_4$) concentration.

Figure 1:
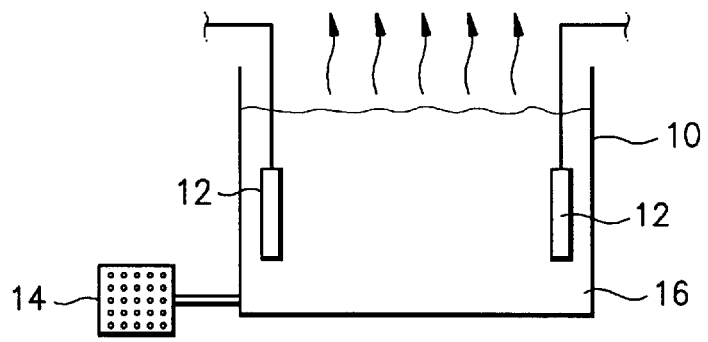
FIG. 1 is a schematic illustration of a conventional wet etching system for manufacturing semiconductor devices.

As described earlier, using the conventional wet etching system shown in FIG. 1 and an 85% concentration of the phosphoric acid ($H_3PO_4$) to etch a nitride layer, the etching process is carried out at a temperature between 170° C. to 174° C., while continuously supplying the deionized water and the phosphoric acid ($H_3PO_4$) as an etchant. However, at a 170° C. processing temperature, the actual phosphoric acid ($H_3PO_4$) concentration is greater than 85%, due to the evaporation of the deionized water through the open top of the tank, which is confirmed by the graph in FIG. 4. In the conventional case, attempts are made to compensate for the evaporated deionized water by continuously supplying the deionized water and the phosphoric acid ($H_3PO_4$) into the tank 10. Such a procedure has been found to be inadequate to precisely control the phosphoric acid ($H_3PO_4$) concentration, and accordingly, different etch rates are experienced by those practicing the conventional method.

The wet etching system shown in FIG. 2 solves the above problems, and maintains a constant phosphoric acid ($H_3PO_4$) concentration inside the tank 20 by condensing the evaporated deionized water on the cover 24 and allowing it to flow back into the tank 20 along the tapered lower surface 24a of the cover 24.

The wet etching method of the present invention is useful in optimizing the concentration of the phosphoric acid ($H_3PO_4$) and the heating temperature, while maintaining the concentration of the phosphoric acid ($H_3PO_4$) constant, thereby improving the etch rate in the etching process. Typically, the etch rate for the nitride layer by the phosphoric acid ($H_3PO_4$) is inversely proportional to the concentration of the phosphoric acid ($H_3PO_4$), and proportional to the heating temperature at the particular concentration value thereof.

In the embodiment of the present invention, phosphoric acid ($H_3PO_4$) at from 80% to 90% concentration, which is commercially available, is supplied into the tank 20 and heated to about 153°. C to 157° C., and preferably 155° C. A semiconductor substrate, having a nitride layer formed thereon with a thickness of 1500Å, is placed in the tank 20 while maintaining the above temperature.

Figure 5:
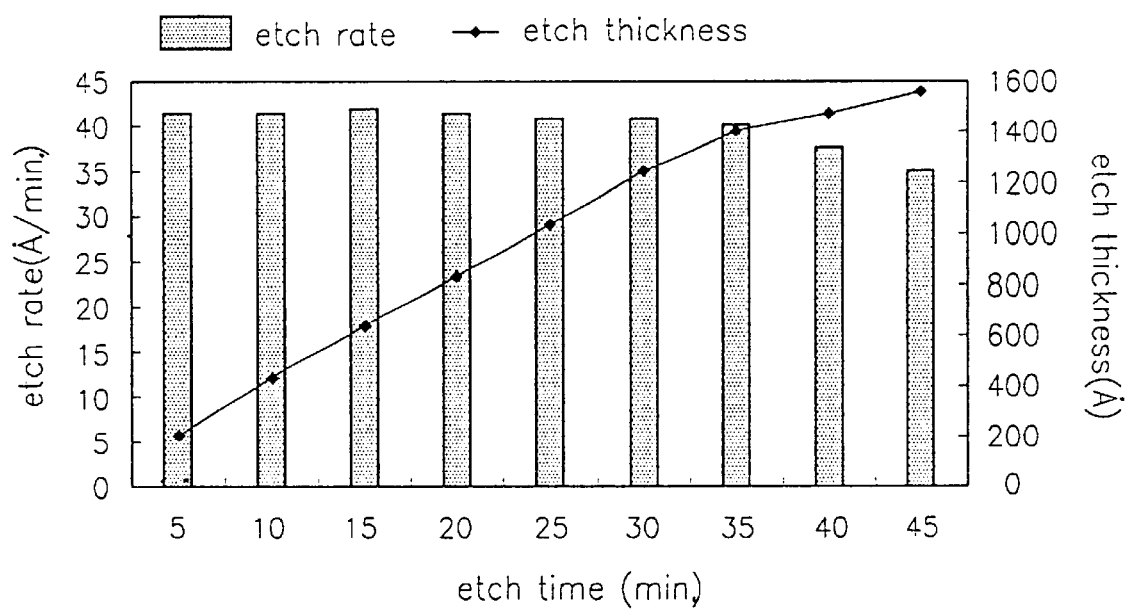
FIG. 5 is a graphical representation comparing the etch rate and the etch thickness as a function of the etch time using the wet etching system according to the present invention.

FIG. 5 is a graphical representation comparing the etch rate and the etch thickness as a function of the etch time in the etching process of the present invention.

Referring to FIG. 5, the etch rate of the nitride layer is about 40Å/min. to 45Å/min. for the first 30 minutes. The reason that the etch rate decreases after 35 minutes is that only a small amount of the nitride layer is still remaining after about 35 minutes, so the etching process is nearly complete after 35 minutes. Compared with the conventional case, where it takes about 70 minutes to etch a nitride layer with a thickness of 1500Å while maintaining the 85% concentration of the phosphoric acid ($H_3PO_4$) at 170° C., the etch time in the present invention is reduced by almost half.

While the case involving a phosphoric acid ($H_3PO_4$) concentration of from 80% to 90% was highlighted in the above example, depending on the operator's purpose and the process conditions, the phosphoric acid ($H_3PO_4$) can be prepared with various concentrations, and the method of the present invention can be utilized for these various concentrations. Referring to FIG. 4, the optimized temperature conditions according to the concentration of phosphoric acid ($H_3PO_4$) can be detected.

Moreover, although the etching of a nitride layer using phosphoric acid ($H_3PO_4$) has been highlighted in the above example, it is understood that the present invention can be applied to etch various layer types, such as an oxide layer, and various etchants may be used, such as nitric acid, sulfuric acid and fluoric acid.

Therefore, according to the present invention, the changes in the chemical concentration within the tank, due to the evaporation of the deionized water, is minimized or prevented. As a result, changes in the etch rate are minimized so that the etching process can be more easily and precisely controlled and the profile of the pattern after the etching can be improved.

Further, according to the present invention, the desired etch rate can be maximized or optimized so that the etching process time is shortened, and the productivity for semiconductor devices is improved.

Further, using the wet etching system of the present invention, the etching process does not require continuous additional supplies of deionized water or chemical, such that the heating time and the process time can be reduced, thereby saving power. This results in less damage to the heater 22 and a greater life span.

While the present invention has been described in detail, it should be understood that various changes, substitutions and alterations can be made thereto without departing from the spirit and scope of the invention as defined by the appended claims.

What is claimed is:

1. A wet etching system for manufacturing semiconductor devices comprising:
   a tank containing a bath of chemical etchant having a volatile component, said tank having an open top portion;
   a heater disposed in the tank for heating the chemical etchant contained therein, which may allow the volatile component of the etchant evaporate; and a cover arranged on the open top portion of the tank, the cover comprising an integral cooling apparatus capable of condensing vapor of the chemical etchant at the cover.

2. The wet etching system of claim 1, wherein the cooling apparatus comprises a cooling water line through which cooling water flows.

3. The wet etching system of claim 1, wherein a lower surface of the cover that confronts said bath is inclined downwardly as extending from opposing edges of the cover toward a central region of the cover.

4. The wet etching system of claim 1, further comprising a gas discharge opening extending through the cover, providing flow communication between an interior of the tank and an ambient atmosphere.

5. The wet etching system of claim 1, further comprising a wafer support disposed in the tank, above the heater, and submerged in said chemical bath for supporting a wafer substrate having a layer to be etched.

6. The wet etching system of claim 5, wherein the heater is ring-shaped and is located in a lower portion of the tank.

7. The wet etching system of claim 5, wherein the chemical etchant comprises phosphoric acid ($H_3PO_4$).

8. The wet etching system of claim 1, further comprising a bubbler connected via a gas line to a lower portion of the tank.

9. The wet etching system of claim 1, further comprising a temperature detecting device connected to an upper portion of the tank for detecting the temperature of the chemical etchant contained inside the tank, wherein the heater is controlled according to the temperature of the chemical etchant detected by the temperature detecting device.

10. The wet etching system of claim 1, wherein the tank and the cover are made of a chemical and acid resistant material.

* * * * *